United States Patent [19]
Gulachenski et al.

[11] Patent Number: 5,910,885
[45] Date of Patent: Jun. 8, 1999

[54] ELECTRONIC STACK MODULE

[75] Inventors: Alan M. Gulachenski, West Millbury, Mass.; Joseph Praino, Washington Township, N.J.; Jack Seidler, Flushing, N.Y.

[73] Assignee: White Electronic Designs Corporation, Phoenix, Ariz.

[21] Appl. No.: 08/984,001

[22] Filed: Dec. 3, 1997

[51] Int. Cl.[6] .............................. H01R 9/09; H01R 4/02
[52] U.S. Cl. ................... 361/774; 361/742; 361/803; 361/804; 439/65; 439/69; 439/74; 439/876
[58] Field of Search ............................ 361/742, 744, 361/770, 773, 774, 790, 803, 804, 743, 787; 257/686, 696, 723, 724, 726; 174/138 G; 439/62, 73, 69, 74, 75, 834, 876, 65

[56] References Cited

U.S. PATENT DOCUMENTS

| | | | |
|---|---|---|---|
| 4,245,876 | 1/1981 | Ritchie et al. | 439/65 |
| 4,555,151 | 11/1985 | Neese et al. | 439/82 |
| 4,592,617 | 6/1986 | Seidler | 439/876 |
| 4,647,126 | 3/1987 | Sobota, Jr. | 361/773 |
| 4,739,125 | 4/1988 | Watanabe et al. | 361/773 |
| 4,873,615 | 10/1989 | Grabbe | 361/742 |
| 5,191,404 | 3/1993 | Wu et al. | 257/724 |

*Primary Examiner*—Leo P. Picard
*Assistant Examiner*—John B. Vigushin
*Attorney, Agent, or Firm*—Joseph Stecewycz

[57] ABSTRACT

An electronic stack module is disclosed comprising two or more substrates having upper and lower surfaces with one or more electronic components disposed on the surfaces and electrically connected to connector pads disposed in a predetermined pattern at the substrate edges. A plurality of clip leads are electrically attached to the connector pads, where each clip lead comprises a clip section, a standoff section of specified length, and a mounting section, the clip section configured to frictionally engage both upper and lower substrate surfaces. Stacking of substrates is accomplished by aligning and bonding clip sections of one substrate to corresponding mating sections of the adjacent substrate.

33 Claims, 7 Drawing Sheets

ELECTRONIC STACK MODULE

BACKGROUND OF THE INVENTION

1. Field of the Invention

The present invention relates to the fabrication of electronic circuit assemblies and, in particular, to a method of stacking of substrates having mounted components so as to increase surface component density in such assemblies.

2. Description of the Prior Art

The electronic components of many conventional electronic circuits are typically mounted on a substrate, such as a circuit board, which provides conductive paths by which the components are interconnected into the desired electronic circuit. The substrate may incorporate peripheral electrical connection points, or connector pins, to provide for electrically connecting the electronic circuit to a system circuit board.

Certain multi-lead electronic components, such as integrated circuits, can be vertically integrated, or stacked, with one or more other physically similar components to form an electronic module which can be mounted to the substrate. By stacking electronic components before mounting, it becomes possible to increase the number of such components electrically connected to the substrate without necessitating a corresponding increase in the surface area of the substrate.

However, the methods of stacking electronic components described in the relevant art often call for custom-designed components, special material or complex fixturing to achieve electrical interconnection between the layers of a multi-layer substrate. As can be appreciated by one skilled in the relevant art, custom materials, processes, and fixturing increase the cost of electronic circuit fabrication.

Moreover, most conventional stacking methods do not provide for the electrical testing of individual electronic components which form the stack. With a conventional stacking configuration, a stack is tested only when completely assembled. If failure results from an individual faulty component, the entire stack may be rejected if the repair of an assembled stack, if possible, is not cost effective.

The present state of the art indicates a need for an improved method of stacking electronic components into electronic circuit assemblies.

It is an object of the present invention to provide a module stacking configuration which improves yield and reduces cost by providing for the test and repair of each individual component in the module prior to installation of the module onto a circuit board.

It is a further object of the present invention to provide such a module which utilizes standard commercially available materials.

It is yet another object of the present invention to provide such a module which uses proven assembly techniques and fixtures.

It is still another object of the present invention to provide such a module which can be mounted so as to overly existing components of a circuit board.

Other objects of the invention will, in part, appear hereinafter and will, in part be apparent when the following detailed description is read in connection with the drawings.

SUMMARY OF THE INVENTION

These objects are achieved by a stacking of electronic circuit assemblies, each assembly comprising a generally planar substrate with upper and lower surfaces, where there are mounted on the substrate one or more electronic devices electrically connected to connector pads disposed at the substrate perimeter. A plurality of clip leads are electrically attached to the connector pads, each clip lead comprising a clip section, a standoff section, and a mounting section, where the clip section is configured to frictionally engage upper and lower substrate surfaces, and the standoff section is configured to extend essentially orthogonal to the substrate. Attaching the corresponding clip leads of adjacent substrates serves to maintain the substrates in a spaced-apart, generally parallel relationship. The length of the standoff section of the clip lead is selected so as to provide the desired clearance between components on adjacent substrate layers. The standoff length of any substrate layer can be selected so as to provide for any desired clearance between the substrate layer and underlying structure or components.

BRIEF DESCRIPTION OF THE DRAWINGS

A fuller understanding of the nature and objects of the present invention will become apparent upon consideration of the following detailed description taken in connection with the accompanying drawings, wherein.

DETAILED DESCRIPTION OF THE INVENTION

The following detailed description of the present invention is not to be taken in a limiting sense but is intended to illustrate the general principles of the invention. The scope of the invention is best defined by the appended claims.

Description of the Invention

Figure 1:
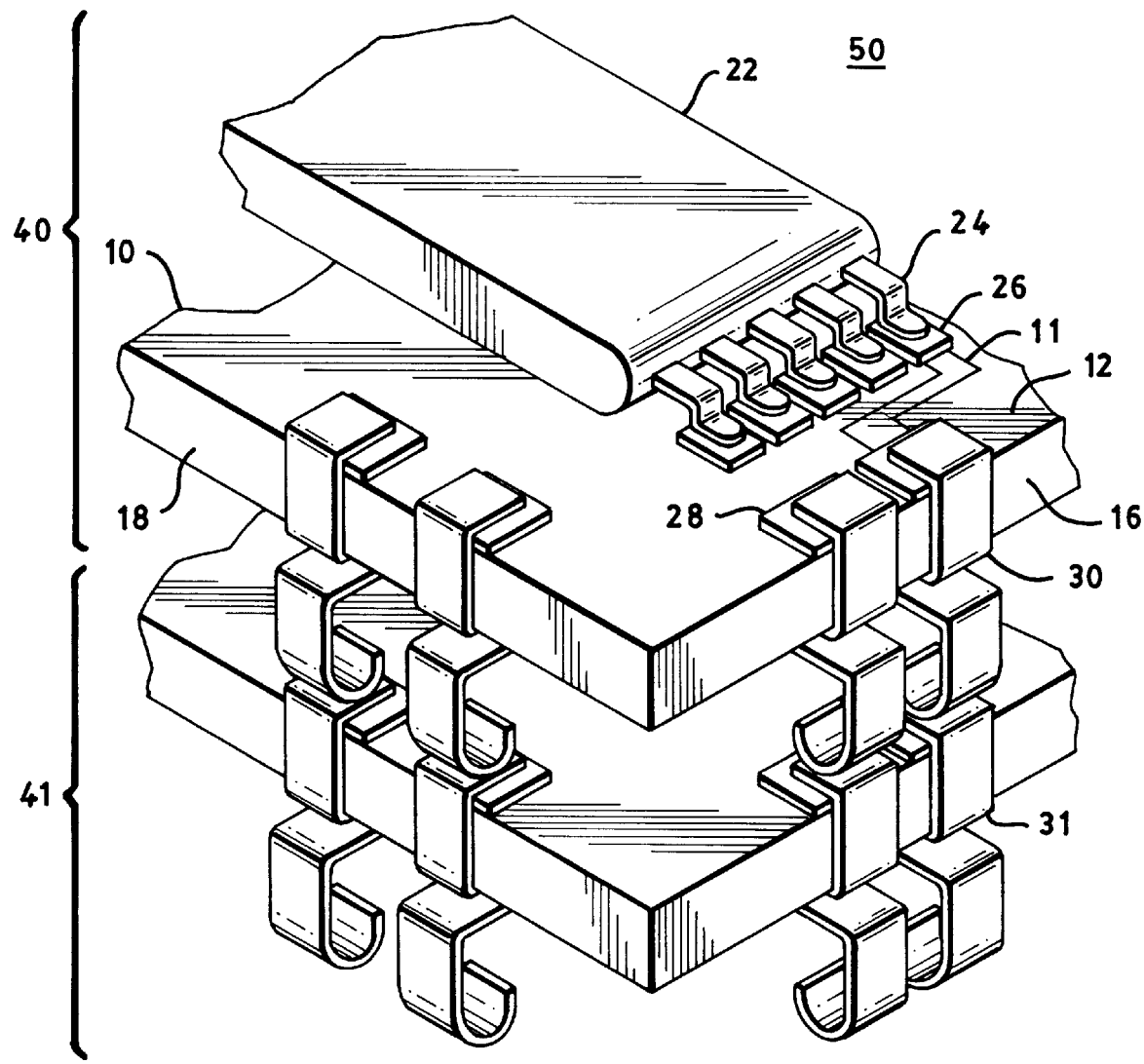
FIG. 1 is a perspective diagrammatical view of one embodiment of a stack module according to the present invention comprising two stack layers with a plurality of clip leads.

There is shown in FIG. 1 a perspective diagrammatic view of a corner portion of a two-layer stacked electronic circuit assembly 50 in accordance with the present invention. One or more electronic devices 22, or similar components, are mounted onto an upper surface 12 of a substrate 10 by the attachment of device electrical leads 24 to corresponding mounting pads 26 disposed on upper substrate surface 12, as is well-known in the relevant art. Substrate 10 is preferably fabricated of an FR4, or equivalent, material. A plurality of connector pads 28 are disposed along at least a portion of the perimeter of substrate 10, here denoted by substrate edges 16 and 18. A conductive trace 11 extends between mounting pad 26 and connector pad 28. A plurality of clip leads 30 are attached to substrate 10, at connector pads 28, in a predetermined pattern to form an electronic circuit assembly 40.

Electronic circuit assembly 40 is mounted onto a second electronic circuit assembly 41 to form stacked electronic circuit assembly 50. Electronic circuit assembly 41 comprises a plurality of clip leads 31 where individual clip leads 31 are bonded to corresponding clip leads 30, in adjacent electronic circuit assembly 40, to provide one or more electrical paths between electronic circuit assemblies 40 and 41. It can be appreciated by one skilled in the art that clip leads 31 are disposed in the same pattern as clip leads 30, and that additional electronic circuit assemblies with clip leads arranged in the same pattern can be added by stacking to produce a multi-layer stacked electronic assembly where each substrate is maintained in a spaced-apart, generally parallel relationship with an adjacent substrate.

Figure 2:
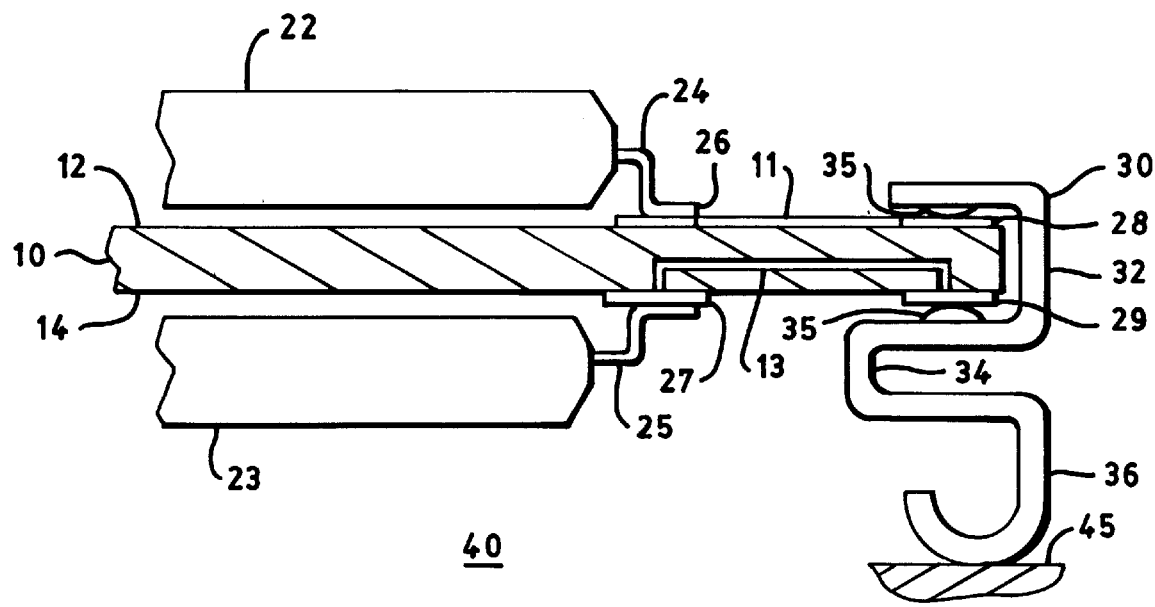
FIG. 2 is a side view of one individual stack layer of the stack module of FIG. 1.

Referring now to FIG. 2, there is shown a cross-sectional view of a portion of electronic circuit assembly 40. Electronic circuit assembly 40 may further comprise one or more electronic devices 23 mounted onto a lower surface 14 of substrate 10 by the attachment of device electrical leads 25 to corresponding mounting pads 27 disposed on lower substrate surface 14. In a multi-layer substrate configuration, there may be provided one or more conductive strips 13, internal to substrate 10 and extending between mounting pads 27 and corresponding connector pads 29. Although electronic devices 22 and 23 are here shown as thin, small outline plastic package (TSOP) semiconductor devices, it should be understood that the present invention can be practiced with surface-mount components or semiconductor devices of other configurations as well, such as SOJ, gull-wing, or other packages. Alternatively, electronic devices 22 and 23 can be through-hole devices.

Preferably, clip leads 30 are attached to substrate 10 after components, such as electronic devices 22 and 23, have been mounted to electronic circuit assembly 40. It should be understood that, for each clip lead 30 attached to substrate 10, there may be provided either or both of connector pads 28 and 29, and that either or both of connector pads 28 and 29 may, in turn, be electrically connected to a corresponding mounting pad 26 or 27, respectively.

Clip lead 30 comprises a clip section 32, a standoff section 34, and a mounting section 36. Standoff section 34 and mounting section 36' form a substantially "J-shaped" configuration. Standoff section 34 extends essentially orthogonal to lower surface 14 when secured to substrate 10 as shown. Mounting section 36 is thus configured to resiliently make contact with the clip section of a corresponding clip lead 31 as best seen in FIG. 1. The length of standoff section 34, in FIG. 2, is selected such that electronic circuit assembly 40 will be spaced a predetermined distance from electronic circuit assembly 41 when stacked, and there is provided clearance between the components of electronic circuit assembly 40, such as semiconductor 23, and the components of electronic circuit assembly 41.

Clip lead 30 is preferably comprised of an electrically-conductive resilient material, such as a copper alloy. Clip lead 30 is retained on substrate 10 by the spring-like action of clip section 32, which has a substantially "U-shape" so as to frictionally engage substrate 10. When attached to substrate 10 as shown, clip lead 30 completes an electrically-conductive path from electronic device 22 through conductive trace 11 to an external surface 45. Surface 45 here represents the electrical contact region of an electrical test fixture, an electronic circuit board, or the clip lead of an underlying substrate layer.

Clip leads 30 thus provide the means by which electronic circuit 40 can be tested or "burned in" before assembly into stacked electronic circuit assembly 50. During testing, electronic circuit assembly 40 is placed into the test fixture (not shown) which is configured such that one or more clip leads 30 are removably connected to a test circuit or to a measurement device, for example. In this manner, any faulty components can be identified and replaced before electronic circuit 40 is assembled into stacked electronic circuit assembly 50. Electronic circuit 41 is tested in a similar manner.

Preferably, at least one solder preform 35 is placed between each clip lead 30 and substrate 10 to provide for electrical connection. In the example provided, solder preforms 35 are placed at connector pads 28 and 29. Solder preforms 35 are subsequently reflowed, as is well-known in the art, before electronic circuit 40 is tested or placed into a higher assembly. In an alternative embodiment, solder preforms 35 are attached to clip leads 30 before clip leads 30 are placed onto substrate 10.

Figure 3:
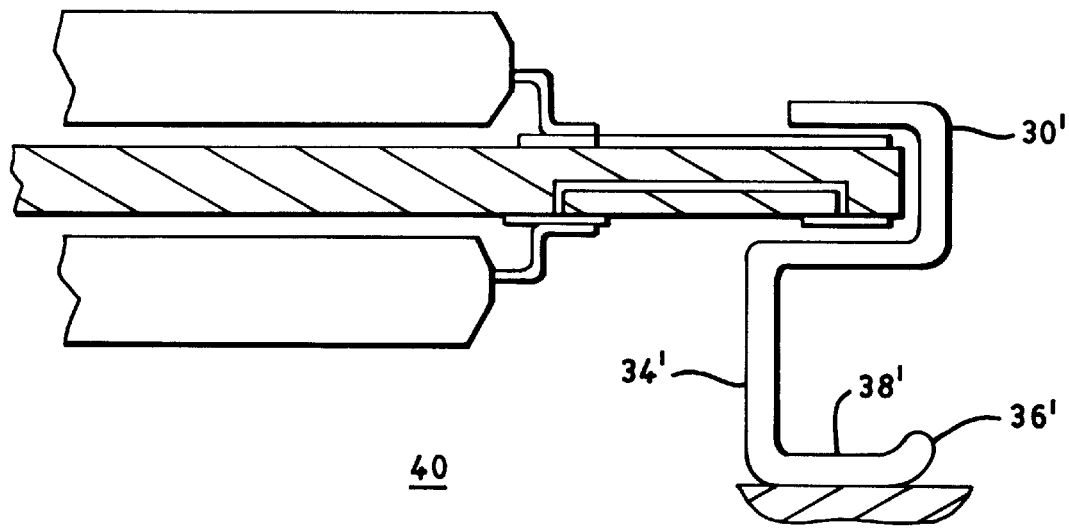
FIG. 3 is a side view of an alternative embodiment of the individual stack layer FIG. 2.

An alternative configuration for electronic circuit is shown in FIG. 3 in which a clip lead 30' is used in place of clip lead 30. Clip lead 30' comprises a standoff section 34' and a mounting section 36' forming a substantially "C-shaped" configuration. Mounting section 36' may comprise a flat portion 38' as shown, or may be curved in the manner of mounting section 36 in FIG. 2. Alternatively, mounting section 36 may comprise an entirely flat segment (not shown).

Figure 4:
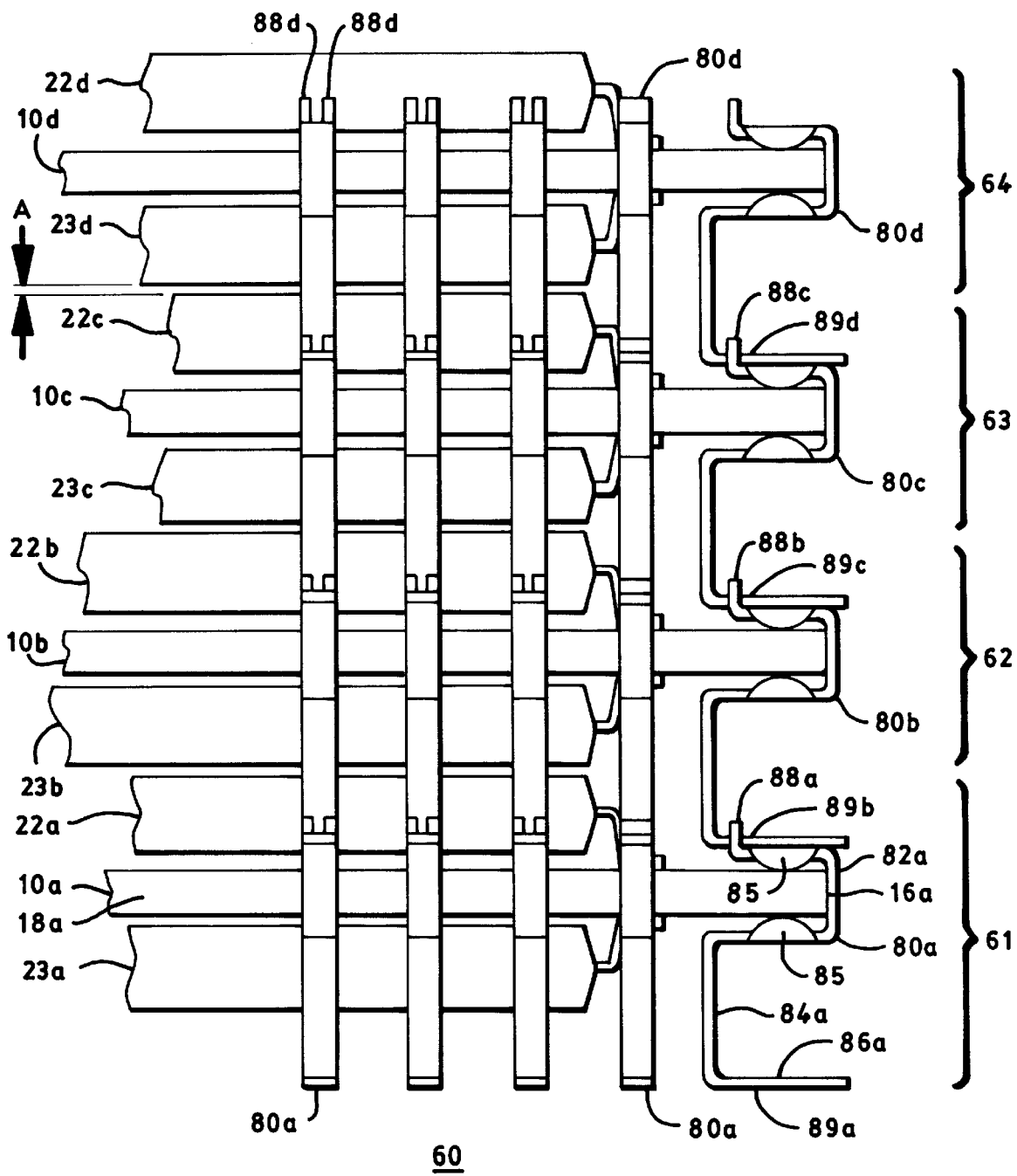
FIG. 4 is a side view of a second embodiment of a stack module comprising four stack layers and an alternative configuration of clip lead.

There is shown in FIG. 4 a side diagrammatical view of an end portion of one embodiment of a four-layer stacked electronic circuit assembly 60, in accordance with the present invention. Stacked electronic circuit assembly 60 comprises electronic circuit assemblies 61, 62, 63, and 64. One or more of electronic circuit assemblies 61, 62, 63, and 64 is fully-tested and repaired as necessary, as described above, before being stacked into the configuration shown to form stacked electronic circuit assembly 60. Electronic circuit assembly 61 comprises one or more electronic components 22a and 23a mounted onto a substrate 10a. A plurality of clip leads 80a are attached to connector pads (not shown) on substrate 10a along a perimeter comprising edges 16a and 18a, preferably by means of solder 85 as shown. For reasons of clarity, only four clip leads 80a are shown at edge 18a, and only one clip lead 80a is shown, in side view, at edge 16a.

Electronic circuit assembly 62 comprises one or more electronic components 22b and 23b, mounted onto a substrate 10a, and a plurality of clip leads 80b. Similarly, electronic circuit assembly 63 comprises clip leads 80c attached to a substrate 10c, and electronic circuit assembly 64 comprises clip leads 80d attached to a substrate 10d. Although not explicitly shown, it should be understood that substrates 10a, 10b, 10c, and 10d may comprise some or all of the elements of substrate 10 (e.g., connector pads, conductive strips, mounting pads, conductive traces).

Clip lead 80a comprises a substantially U-shaped clip section 82a, a standoff section 84a, and a mounting section 86a. In the example provided, standoff section 84a and mounting section 86a form a substantially "L-shaped" configuration, but may alternatively comprise a C-shaped or J-shaped configuration (as illustrated and described above). Standoff section 84a extends essentially orthogonal to the lower surface of substrate 10a, as shown. In the preferred embodiment, standoff section 84a is approximately 0.073 inch or greater in length to provide clearance (indicated as dimension "A") of approximately 0.005 inch or more between standard TSOP device packages mounted on substrates 10a, 10b, 10c, and 10d. Clip lead 80a is provided with tabs 88a extending from clip section 82a, and an interlocking feature 89a in mounting section 86a (described in greater detail below). Interlocking features 89b, 89c, and 89d are configured to releasably mate with tabs 88a, 88b, and 88c respectively.

Tabs 88a are formed at an angle with the upper flat portion of clip section 82a and thus extends away from substrate 10a when clip lead 80a is attached at edge 16a. This angle may be an acute angle, or may be approximately 90° as shown. As electronic circuit assembly 62 is stacked onto electronic circuit assembly 61, a plurality of tabs 88a are mated with interlocking features 89b of corresponding clip leads 80b. The mating of tabs 88a with interlocking features 89b provides for a more positive alignment of electronic circuit assembly 61 with electronic circuit assembly 62, and further serves to provide mechanical integrity in stacked electronic circuit assembly 60.

To complete the physical assembly of stacked electronic circuit assembly 60, electronic circuit assembly 63 is stacked onto electronic circuit assembly 62, with tabs 88b mated with corresponding interlocking features 89c of respective adjacent clip leads 80c, and electronic circuit assembly 64 is stacked onto electronic circuit assembly 63, with tabs 88c mated with corresponding interlocking features 89d of respective adjacent clip leads 80d. In the preferred method, stacked electronic circuit 60 is placed into a furnace, or other high-temperature chamber, and heated at a temperature sufficient to reflow solder 85 between each clip lead and connector pad, and between clip leads. This operation serves to mechanically and electrically bond together electronic circuit assemblies 61, 62, 63, and 64 to form stacked electronic circuit assembly 60.

In an alternative method, an assembly fixture (not shown) is used to clamp together stacked electronic circuit assembly 50 (see FIG. 1) or 60 and insure that alignment between adjacent circuit assemblies is maintained. When clamped, electronic circuit assembly 50 or 60 is dipped into molten solder to form the intended electrical and mechanical connections between electronic circuit assemblies 61, 62, 63, and 64. After the soldering operation has been completed by either of the above methods, stacked electronic circuit assembly 50 or 60 is tested to determine if there are any failures. Any detected failures can be repaired by disassembling stacked electronic circuit assembly 50 or 60, replacing defective components, and then reassembling as described above.

Figure 5C:
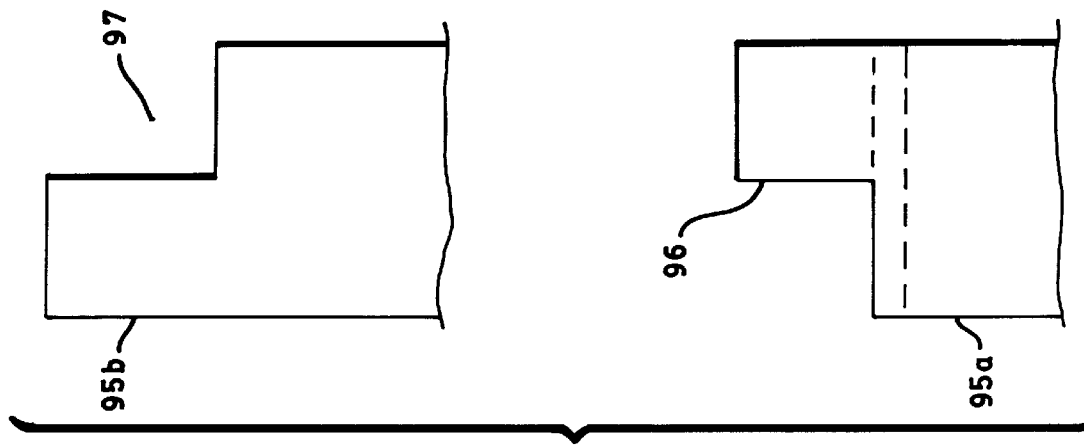
FIGS. 5A through 5C are alternative embodiments of the interlocking features provided in the clip leads of FIG. 4.
Figure 5B:
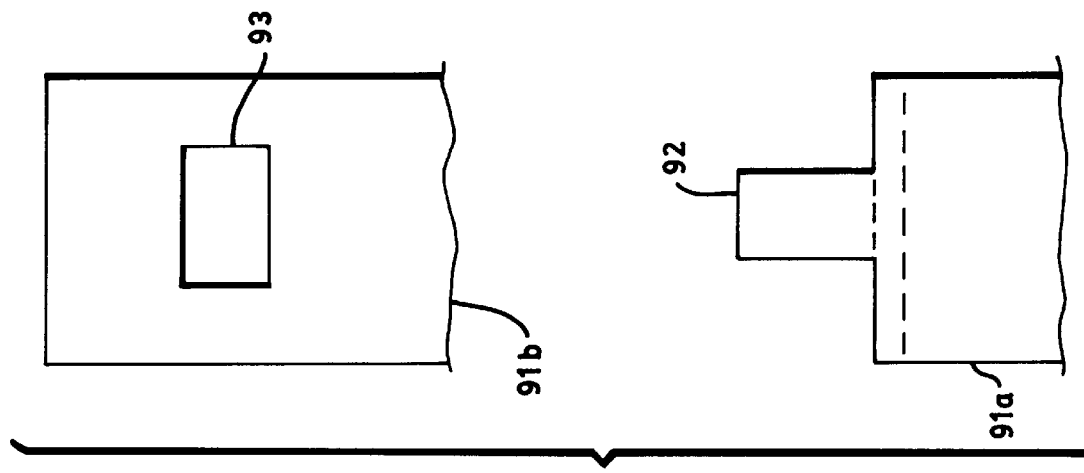
Figure 5A:
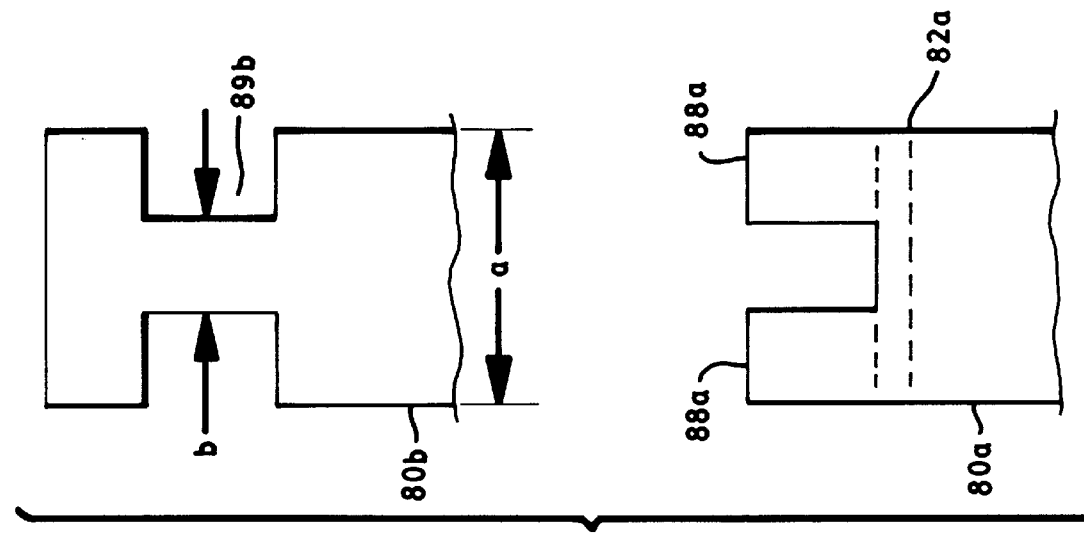

As best seen in FIG. 5A, interlocking feature 89b may comprise a neck region in clip lead 80b (here shown in top view for clarity). For this configuration, tabs 88a, as shown, are provided in clip section 82a of clip lead 80a (here shown in side view for clarity). In a preferred embodiment, clip lead width "a" is approximately 0.018 inch and neck region width "b" is approximately 0.010 inch. In an alternative embodiment, shown in FIG. 5B, clip lead 91b comprises a slot 93 configured to mate with a tab 92 extending from an adjacent clip lead 91a. In another alternative embodiment, shown in FIG. 5C, there is provided a notch 97 in a clip lead 95b configured to mate with a tab 96 provided in an adjacent clip lead 95a.

Figure 6:
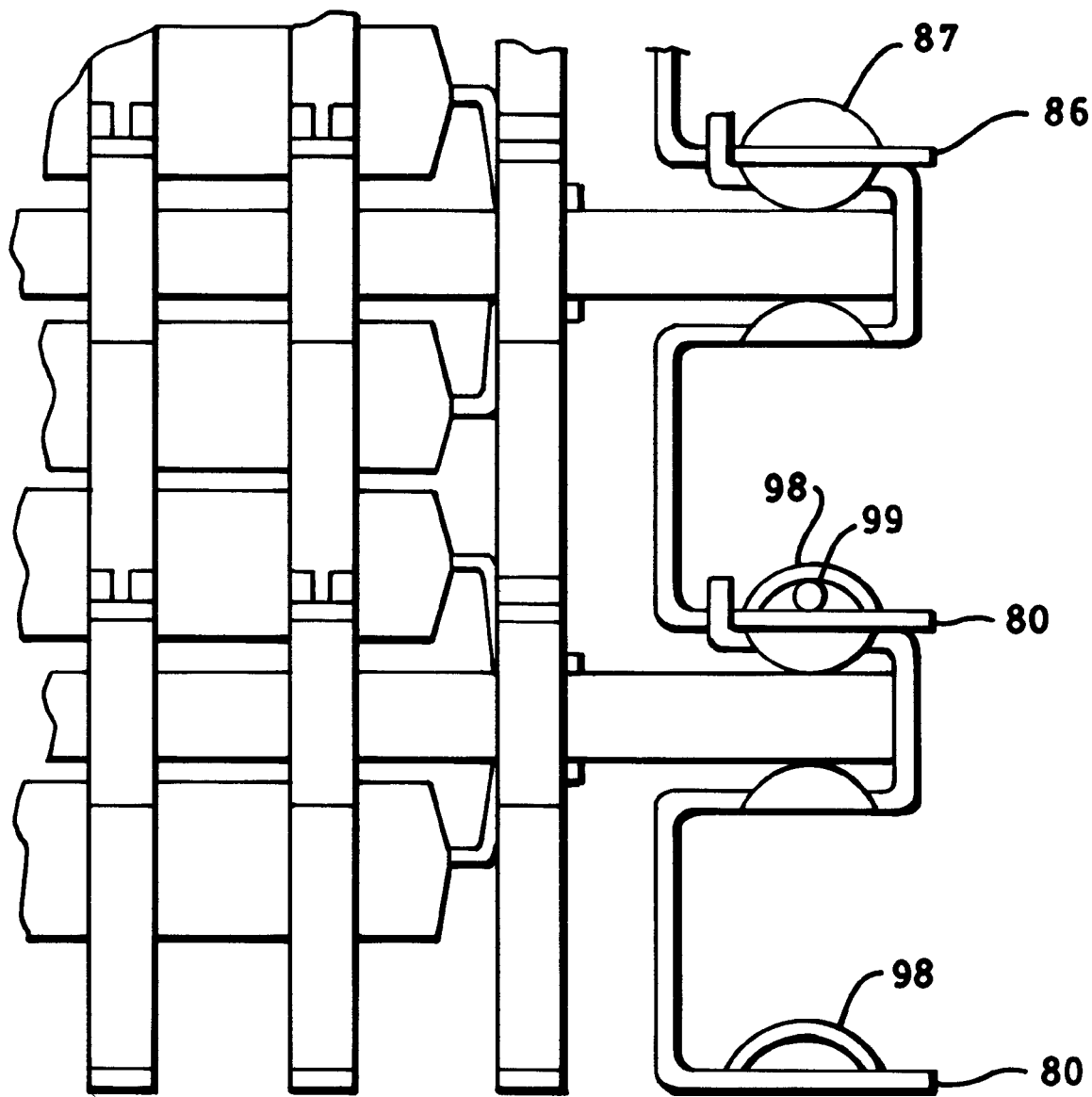
FIG. 6 is an alternate embodiment of the stack module of FIG. 4.

For applications in which additional bonding may be desired, there can be provided optional solder 87 on an upper surface of mounting section 86 as shown in FIG. 6. Optional solder 87 is formed by reflowing a solder preform 99 retained on mounting section 86 by means of a strap or band 98 formed in clip lead 80. For purposes of illustration, lowermost clip lead 80 is shown with band 98 only, middle clip lead 80 is shown with solder preform 99 inserted into and retained by band 98, and mounting section 86 is shown with optional solder 87 after reflow.

Figure 8:
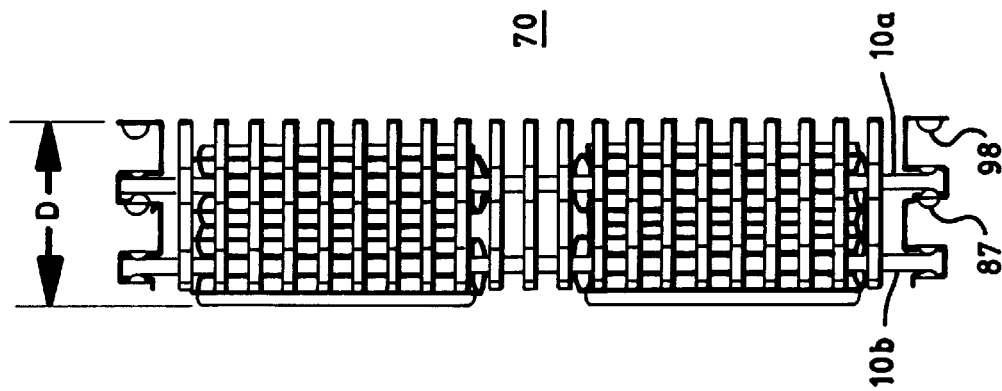
FIG. 8 is the preferred embodiment of a stack module comprising two stack layers in accordance with the present invention; and, FIGS. 9, 10, and 11 are alternative embodiments of the stack module of FIG. 7.
Figure 7:
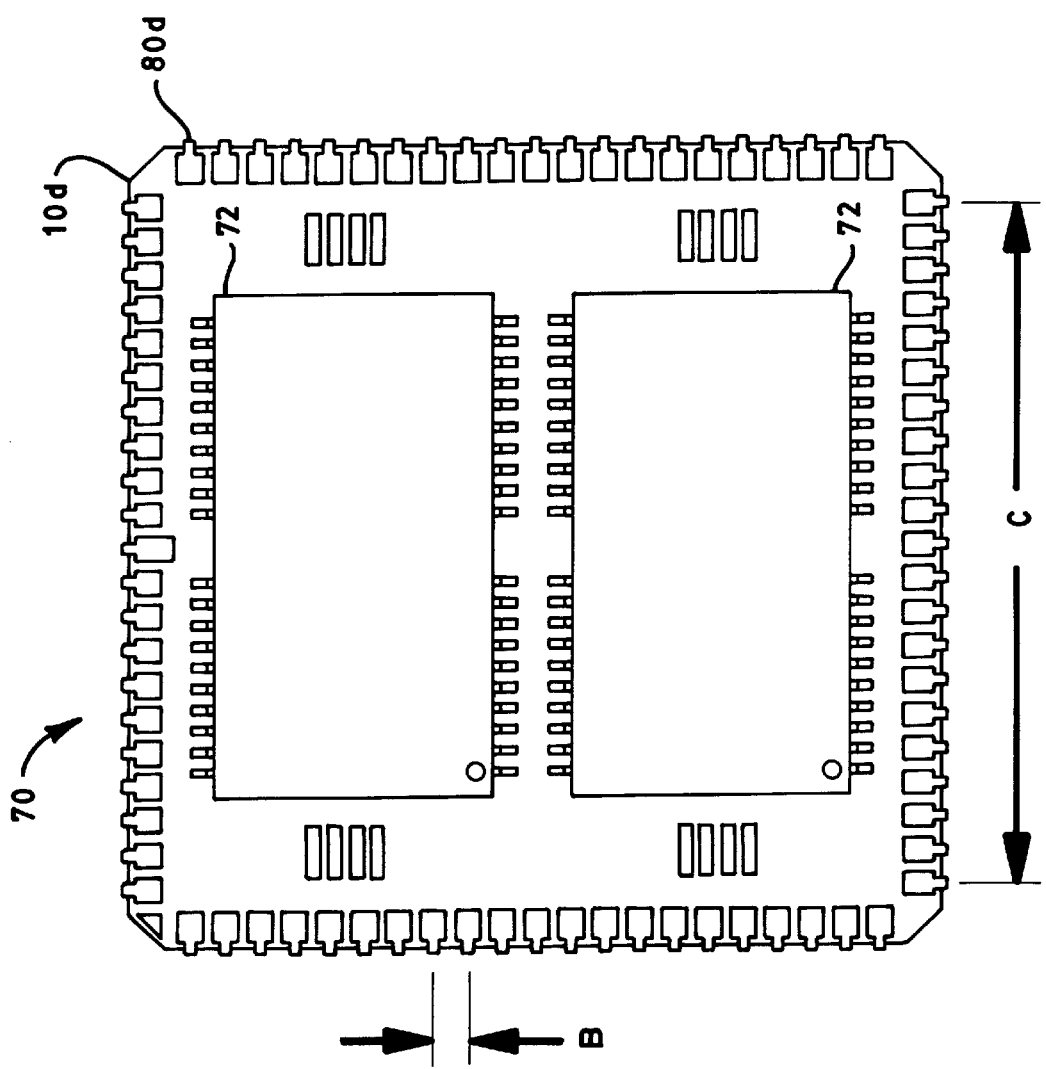
FIG. 7 is a top view of the stack module of FIG. 4.

In a preferred embodiment, shown in FIGS. 7 and 8, a stacked electronic circuit assembly 70 comprises a plurality of clip leads, such as clip leads 80d, arranged in the configuration of a JEDEC standard 84-lead PLCC device. The center-to-center spacing between adjacent clip leads, indicated by dimension "B," is approximately 0.050 inch, and the center-to-center spacing for all twenty-one clip leads emplaced at one side of a substrate, such as substrate 10d, indicated by dimension "C," is approximately 1.000 inch. This configuration allows for the mounting of, for example, two 8 Meg×8 FLASH memory 40-lead TSOP Type II package devices 72 per substrate surface as shown.

Stacked electronic circuit assembly 70 comprises substrates 10a and 10b for an electronic stack module height, indicated by dimension "D," of approximately 0.282 inch. Clip leads 80d retained on substrate 10a comprise band 98 only, and clip leads 80d retained on substrate 10b comprise optional solder 87.

Figure 9:
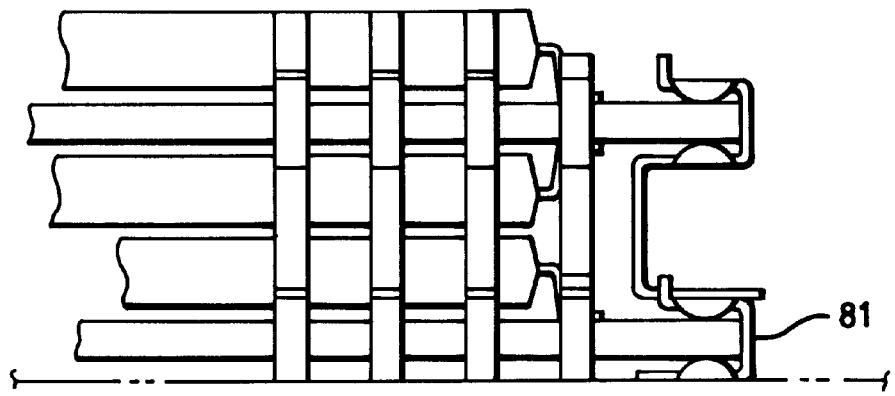
Figure 10:
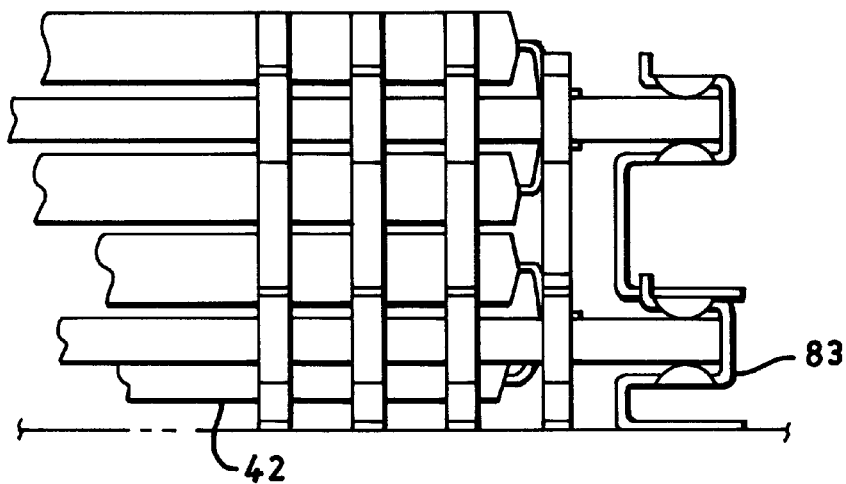
Figure 11:
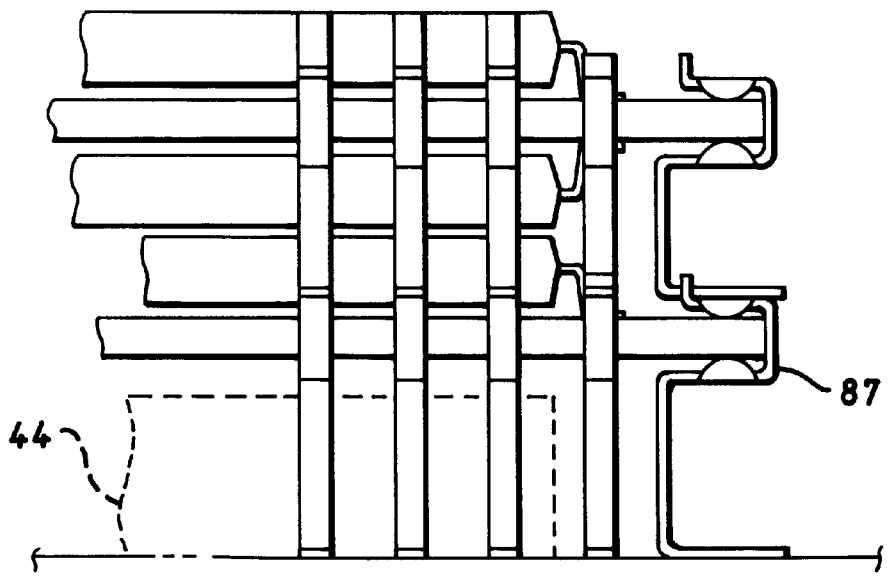

It should be understood that the lengths of the clip lead standoff sections need not be the same for clip leads in different substrate layers. For example, clip leads 81 in the lowermost substrate layer may be formed without standoff sections and mounting sections, as shown in FIG. 9, to provide for a lower stack profile in applications in which there are no underlying components on a circuit board. In another example, shown in FIG. 10, clip leads 83 in the lowermost substrate layer have a standoff section of length less than that of standoff sections in upper layers, so as to accommodate a relatively thin component 42 on the underside of the lowermost substrate. In yet another example, shown in FIG. 11, clip leads in the lowermost substrate layer have a standoff section of length greater than that of standoff sections in upper layers, so as to enable the lowermost substrate to overly a relatively large component 44 mounted on the circuit board.

Having thus described the inventive device with reference to the several embodiments, it will be understood that other modifications and variations may occur to those skilled in the art without departing from the spirit and the scope of the invention. Accordingly, the various changes in form and in detail which may be made are intended to fall within the scope of the appended claims.

What is claimed is:

1. An electronic circuit assembly, comprising:

a substrate comprising upper and lower surfaces, said substrate further comprising a first set of mounting pads disposed upon at least one of said substrate surfaces;

at least one electronic device comprising a plurality of electrical leads, said device leads being electrically connected to said first set of mounting pads;

a plurality of connector pads disposed upon at least one of said substrate surfaces;

electrical conduction means extending from at least one of said first set of mounting pads to at least one of said plurality of connector pads; and, a plurality of clip leads, each said clip lead comprising a clip section, a standoff section, and a mounting section, said clip section configured to frictionally engage upper and lower substrate surfaces so as to retain said clip lead to said substrate, said clip section comprising at least one tab extending at an angle to said substrate surface, said mounting section comprising an interlocking feature configured so as to releasably mate with said at least one tab each said clip lead emplaced so as to be in electrical communication with a corresponding said connector pad.

2. An electronic circuit assembly as in claim 1 further comprising solder means for electrically connecting at least one of said plurality of clip leads to a corresponding said connector pad.

3. An electronic circuit assembly as in claim 1 wherein said electrical conduction means comprises a conductive trace disposed upon at least one of said substrate surfaces.

4. An electronic circuit assembly as in claim 1 wherein said electrical conduction means comprises a conductive strip disposed within said substrate.

5. An electronic circuit assembly as in claim 1 wherein said clip section is substantially U-shaped.

6. An electronic circuit assembly as in claim 1 wherein said interlocking feature comprises a neck region.

7. An electronic circuit assembly as in claim 1 wherein said interlocking feature comprises a slot.

8. An electronic circuit assembly as in claim 1 wherein said interlocking feature comprises a notch.

9. An electronic circuit assembly as in claim 1 wherein said mounting section is substantially J-shaped.

10. An electronic circuit assembly as in claim 1 wherein said mounting section is substantially C-shaped.

11. An electronic circuit assembly as in claim 1 wherein said mounting section is substantially L-shaped.

12. An electronic circuit assembly as in claim 1 wherein said standoff section extends essentially orthogonal to said substrate lower surface.

13. An electronic circuit assembly as in claim 1 wherein said plurality of clip leads is arranged in the configuration of a JEDEC standard 84-lead PLCC device.

14. A stacked electronic circuit assembly comprising:
    a first circuit assembly comprising
        a first substrate comprising upper and lower surfaces and an edge, said first substrate further comprising a first electronic device mounted to one of said first substrate surfaces;
        a first plurality of connector pads disposed at said first substrate edge, wherein at least one of said first connector pads is in electrical communication with said first electronic device; and
        a plurality of first clip leads, each said first clip lead comprising a clip section, a first standoff section, and a mounting section, said clip section configured to frictionally engage said first substrate, said plurality of first clip leads emplaced in a predetermined pattern proximate said first substrate edge such that at least one of said plurality of first clip leads is in electrical communication with a corresponding one of said first connector pads;
    a second circuit assembly electrically attached to said first circuit assembly, said second circuit assembly comprising
        a second substrate comprising upper and lower surfaces and an edge, said second substrate further comprising a second electronic device mounted to one of said second substrate surfaces;
        a second plurality of connector pads disposed at said second substrate edge, wherein at least one of said second connector pads is in electrical communication with said second electronic device; and
        a plurality of second clip leads, each said second clip lead comprising a clip section, a second standoff section, and a mounting section, said plurality of second clip leads emplaced proximate said second substrate edge in said predetermined pattern such that at least one of said plurality of second clip leads is thereby placed into electrical communication with a corresponding one of said second connector pads;
        solder means for electrically connecting at least one of said plurality of clip leads to a corresponding said connector pad; and,
        bonding means, for electrically connecting said mounting section of at least one of said plurality of first clip leads to said clip section of a corresponding one of said plurality of second clip leads such that said first substrate is maintained in a spaced-apart, generally parallel relationship with said second substrate.

15. A stacked electronic circuit assembly as in claim 14 wherein said clip section is substantially U-shaped.

16. A stacked electronic circuit assembly as in claim 14 wherein said clip section comprises at least one tab extending at an angle to said substrate surface.

17. A stacked electronic circuit assembly as in claim 16 wherein said mounting section comprises an interlocking feature configured so as to releasably mate with said at least one tab.

18. A stacked electronic circuit assembly as in claim 17 wherein said interlocking feature comprises a neck region.

19. A stacked electronic circuit assembly as in claim 17 wherein said interlocking feature comprises a slot.

20. A stacked electronic circuit assembly as in claim 17 wherein said interlocking feature comprises a notch.

21. A stacked electronic circuit assembly as in claim 14 wherein said mounting section is substantially J-shaped.

22. A stacked electronic circuit assembly as in claim 14 wherein said mounting section is substantially C-shaped.

23. A stacked electronic circuit assembly as in claim 14 wherein said mounting section is substantially L-shaped.

24. A stacked electronic assembly as in claim 14 wherein said bonding means comprises solder.

25. A stacked electronic assembly as in claim 14 further comprising a third electronic device mounted to the other of said substrate surfaces.

26. A stacked electronic circuit assembly as in claim 14 further comprising a third circuit assembly electrically attached to said stacked electronic circuit assembly.

27. A stacked electronic circuit assembly as in claim 14 wherein said mounting section comprises a band.

28. A stacked electronic circuit assembly as in claim 27 wherein said mounting section further comprises solder means.

29. An electronic circuit assembly as in claim 14 wherein said predetermined pattern conforms to the configuration of a JEDEC standard 84-lead PLCC device.

30. A method for assembling an electronic circuit assembly, said method comprising the steps of:
    obtaining a first substrate comprising: upper and lower surfaces, a plurality of first connector pads disposed upon at least one of said first substrate surfaces, and at least a first electronic device disposed upon one of said first substrate surfaces and electrically connected to at least one of said first connector pads;
    attaching a first plurality of clip leads to said first substrate to form a first electronic circuit assembly, each said clip lead comprising a clip section, a standoff section, and a mounting section comprising an interlocking feature, said clip section configured to frictionally engage said upper and lower first substrate surface so as to retain said clip lead to said first substrate, each said standoff section extending essentially orthogonal to said first substrate lower surface, each said clip lead emplaced so as to be in electrical communication with a corresponding one of said first plurality of connector pads, said first electronic circuit assembly comprising said first substrate and said first plurality of clip leads;

obtaining a second substrate comprising: upper and lower surfaces, a plurality of second connector pads disposed upon at least one of said second substrate surfaces, and at least a second electronic device disposed upon one of said second substrate surfaces and electrically connected to at least one of said second plurality of connector pads;

attaching a second plurality of clip leads to said second substrate to form a second electronic circuit assembly, each said clip section attached to said second substrate comprising at least one tab extending at an angle to said second substrate, each said clip lead emplaced so as to be in electrical communication with a corresponding one of said second plurality of connector pads, said second electronic circuit assembly comprising said second substrate and said second plurality of clip leads;

stacking said first electronic circuit assembly onto said second electronic circuit assembly such that each said tab releasably mates with a corresponding interlocking feature, and such that said first electronic circuit assembly is maintained in a spaced-apart, generally parallel relationship with said second electronic circuit assembly; and, soldering each of said first plurality of clip leads to a corresponding one of said second plurality of clip leads.

31. The method of claim 30 wherein said step of attaching said clip leads comprises soldering.

32. The method of claim 30 further comprising the step of testing said first electronic circuit assembly prior to said step of stacking.

33. The method of claim 30 wherein said first plurality of clip leads are arranged in the configuration of a JEDEC standard 84-lead PLCC device.

\* \* \* \* \*